United States Patent [19]

Iwaki et al.

[11] Patent Number: 5,998,879
[45] Date of Patent: Dec. 7, 1999

[54] SEMICONDUCTOR MEMORY DEVICE

[75] Inventors: Hiroaki Iwaki; Kouichi Kumagai, both of Tokyo, Japan

[73] Assignee: NEC Corporation, Tokyo, Japan

[21] Appl. No.: 09/017,960

[22] Filed: Feb. 3, 1998

[30] Foreign Application Priority Data

Feb. 3, 1997 [JP] Japan ................................. 9-020654

[51] Int. Cl.$^6$ ................................................. H01L 27/11
[52] U.S. Cl. ........................... 257/903; 257/347; 257/369
[58] Field of Search .................................. 257/369, 903, 257/347; 365/154, 156

[56] References Cited

U.S. PATENT DOCUMENTS

| 5,526,303 | 6/1996 | Okajima ................................. 365/154 |
| 5,654,572 | 8/1997 | Kawase ................................... 257/371 |

FOREIGN PATENT DOCUMENTS 62-81055  4/1987  Japan .

Primary Examiner—Jerome Jackson, Jr.
Assistant Examiner—George C. Eckert, II
Attorney, Agent, or Firm—Foley, Hoag & Eliot LLP

[57] ABSTRACT

In a CMOS SRAM cell formed on an SOI substrate and including a flip-flop having first and second NMOS and PMOS transistors, transfer gates having first and seconf MOS transistors, and a word line section, characterized in that:the word line section extends along a predetermined direction; that source and drain diffusion layer regions of the first and second NMOS and PMOS transistors are arranged along the predetermined direction, and gates of these NMOS and PMOS transistors are arranged on channel regions thereof in a direction perpendicular to the predetermined direction; that the gates of the first and second NMOS transistors are electrically connected to the gates of the first and second PMOS transistors, respectively; and that in regions between the gates of the first and second NMOS transistors on the channel regions and the gates of the first and second PMOS transistors on the channel regions, each of the drain diffusion layer regions of the fisrt and second NMOS and PMOS transistors, and each one of the drain and source diffusion layer regions of the first and second MOS transistors are respectively arranged to be adgacent to each other and are electrically connected to each other, respectively, through a diffusion layer interconnection.

30 Claims, 13 Drawing Sheets

SEMICONDUCTOR MEMORY DEVICE

BACKGROUND OF THE INVENTION

1. Field of the Invention

The present invention relates to a Static Random Access Memory (to be simply referred to as an SRAM hereinafter) and, more particularly, to the structure and layout of a memory cell as a semiconductor element.

2. Description of the Prior Art

In general, an SRAM using flip-flops as data storage means is faster than a Dynamic Random Access Memory (to be referred to as a DRAM hereinafter) using capacitors as data storage means, and requires no data refresh. On the other hand, the number of elements constituting one memory cell of the SRAM is larger than that of the DRAM, and hence the area of one memory cell of the SRAM is several times larger than that of the DRAM.

As shown in FIG. 6, a conventional, basic CMOS (Complementary Metal Oxide Semiconductor) SRAM cell circuit includes two PMOS transistors 301 and 302 and four NMOS transistors 311, 312, 321, and 322.

The source terminals of the two PMOS transistors 301 and 302 are respectively connected to power supply (Vdd) lines. The source terminals of the two NMOS transistors 311 and 312 are respectively connected to ground (Gnd) lines. The drain terminal of the PMOS transistor 301 is connected to the drain terminal of the NMOS transistor 311. The gate terminal of the PMOS transistor 301 is connected to the gate terminal of the NMOS transistor 311. Similarly, the drain terminal of the PMOS transistor 302 is connected to the drain terminal of the NMOS transistor 312. The gate terminal of the PMOS transistor 302 is connected to the gate terminal of the NMOS transistor 312. As is obvious from this arrangement, the PMOS transistor 301 and the NMOS transistor 311 constitute a CMOS inverter. Similarly, the PMOS transistor 302 and the NMOS transistor 312 constitute a CMOS inverter. One input terminal of each of the two CMOS inverters is connected to the other output terminal thereof so as to constitute a flip-flop.

One of the source and drain terminals of each of the NMOS transistors 321 and 322 is connected to one output terminal of a corresponding one of the two CMOS inverters, and the other of the source and drain terminals of each transistor is connected to a corresponding one of two bit lines D and DB. The gate terminals of the two NMOS transistors are connected to a word line WL. The NMOS transistors 321 and 322 are connected in this manner to serve as transfer gates between the flip-flop and the bit lines. Note that an inverted signal of a signal input to the bit line D is input to the bit line DB.

The operation of the CMOS SRAM cell circuit having the above arrangement will be described below. When the potential of the word line WL is set at High level, the two NMOS transistors 321 and 322 serving as the transfer gates are turned on. As a result, data is written in the flip-flop or read out therefrom in accordance with complementary signals transferred through the bit lines D and DB. In contrast to this, when the potential of the word line WL is set at Low level, the two NMOS transistors 321 and 322 serving as the transfer gates are turned off, the data written in the flip-flop immediately before the transistors are turned off is held.

The structure of a CMOS SRAM cell circuit (to be referred to as reference 1), of the above CMOS SRAM cell circuits, which is formed on a silicon substrate by using a bulk CMOS technique will be described next with reference to FIGS. 1 and 2. As shown in FIG. 1, the CMOS SRAM cell circuit as reference 1 includes element regions 910, 920, and 930, gate interconnections, 941, 942, and 943, first aluminum interconnections 952, 971, and 972, second aluminum interconnections 951, 961, and 962, contact holes 980a to 980j, and through holes 990a to 990c. In this case, the term "element region" is a general term indicating a region, on the silicon substrate, on which the source diffusion layer, drain diffusion layer, and channel region of a MOS transistor are formed. In addition, the gate interconnection 941 corresponds to the word line WL in FIG. 6, and the second aluminum interconnections 961 and 962 respectively correspond to the bit lines D and DB in FIG. 6. The second aluminum interconnection 951 and the first aluminum interconnection 952 are ground potential (Gnd) lines and electrically connected to $n^+$-type diffusion layer regions 911 and 921 (see FIG. 2) serving as the sources of NMOS transistors (NMOS transistors 311 and 312 in FIG. 6) constituting a flip-flop through the through hole 990a and the contact holes 980a and 980b. Although not shown, a power supply voltage (Vdd) is applied to a $p^+$-type diffusion layer region 931 in the element region 930.

FIG. 2 is a plan view showing only the element regions 910, 920, and 930 and the gate interconnections 941, 942, and 943 of the cell structure shown in FIG. 1. $N^+$-type diffusion layer regions 911, 912, 913, 921, 922, and 923 of NMOS transistors (corresponding to the NMOS transistors 311, 312, 321, and 322 in FIG. 6) using the gate interconnections 942 and 943 and the gate interconnection 941 corresponding to the word line WL as gates are formed in the element regions 910 and 920. $P^+$-type diffusion layer regions 931, 932, and 933 of PMOS transistors (corresponding to the PMOS transistors 301 and 302 in FIG. 6) using the gate interconnections 942 and 943 as gates are formed in the element region 930.

More specifically, the constituent elements shown in the plan view of FIG. 2 respectively correspond to the elements of the circuit in FIG. 6 as follows. Of the MOS transistors each using the gate interconnection 942 as a gate in FIG. 2, the PMOS transistor having the $p^+$-type diffusion layer regions 931 and 932 as a source and a drain, respectively, corresponds to the PMOS transistor 301 in FIG. 6. The NMOS transistor having the $n^+$-type diffusion layer regions 911 and 912 as a source and a drain, respectively, corresponds to the NMOS transistor 311 in FIG. 6. Similarly, of the MOS transistors each using the gate interconnection 943 as a gate in FIG. 2, the PMOS transistor having the $p^+$-type diffusion layer regions 931 and 933 as a source and a drain, respectively, corresponds to the PMOS transistor 302 in FIG. 6. The NMOS transistor having the $n^+$-type diffusion layer regions 921 and 922 as a source and a drain, respectively, corresponds to the NMOS transistor 312 in FIG. 6. Of the MOS transistors using the gate interconnection 941 as a gate, the NMOS transistor having the $n^+$-type diffusion layer regions 912 and 913 as a source and a drain, and vice versa, respectively, corresponds to the NMOS transistor 321 in FIG. 6. The NMOS transistor having the $n^+$-type diffusion layer regions 922 and 923 as a source and a drain, and vice versa, respectively, corresponds to the NMOS transistor 322 in FIG. 6.

Referring to FIG. 1 again, the second aluminum interconnection 951 is a ground potential (Gnd) line and connected to the first aluminum interconnection 952 through the through hole 990a. The first aluminum interconnection 952 is connected to the $n^+$-type diffusion layer regions 911 and 921 (see FIG. 2) through the contact holes 980a and 980b. With this arrangement, the Gnd potential is applied to the n+-type diffusion layer regions 911 and 921. Although not shown, the power supply potential Vdd is applied to the p+-type diffusion layer region 931, as described above. Referring to FIGS. 1 and 2, the p+-type diffusion layer region 932 and the n+-type diffusion layer region 912 are connected to the first aluminum interconnection 971 through the contact holes 980c and 980d. The first aluminum interconnection 971 is connected to the gate interconnection 943 through the contact hole 980e. The p+-type diffusion layer region 933 and the n+-type diffusion layer region 922 are connected to the first aluminum interconnection 972 through the contact holes 980f and 980g. The first aluminum interconnection 972 is connected to the gate interconnection 942 through the contact hole 980h. With the above connection, the flip-flop in FIG. 6 is formed.

The second aluminum interconnections 961 and 962 in FIG. 1 respectively correspond to the bit lines D and DB in FIG. 6. The gate interconnection 941 in FIG. 1 corresponds to the word line WL in FIG. 6. The n+-type diffusion layer regions 913 and 923 in FIG. 2 are respectively connected to the second aluminum interconnections 961 and 962 serving as the bit lines D and DB through the through holes 990b and 990c. With this connection, since the gate interconnection 941 serves as the gate of the NMOS transistors 321 and 322 in FIG. 6, transfer gates which are turned on/off in accordance with signals transferred through the word line WL are formed between the bit lines D and DB and the internal terminals of the flip-flop.

The cross-sectional structure of the CMOS SRAM cell as reference 1 will be described next with reference to FIG. 3. FIG. 3 shows the cross-section designated in FIG. 2.

As shown in FIG. 3, in the CMOS SRAM cell as reference 1 using the bulk CMOS technique, a p-type well region 1051 and an n-type well region 1052 are formed in a silicon substrate 1060. NMOS transistors each using the gate interconnection 942 as a gate are formed in the element region in the p-type well region 1051. PMOS transistors each using the gate interconnection 942 as a gate are formed in the element region in the n-type well region 1052. An oxide film 1070 for element isolation is formed between the NMOS transistors and the PMOS transistors. The Gnd potential is applied to the p-type well region 1051, and the Vdd potential is applied to the n-type well region 1052 to reversely bias the p-n junction portion between the p-type well region 1051 and the n-type well region 1052, thereby realizing element isolation. To apply these two element isolation techniques to this structure, a space of several pm or more must be ensured between the n+-type diffusion layer region 912 and the end portion, of the n-type well region 1052, which is close to the p-type well region 1051 and between the p+-type diffusion layer region 932 and the end portion, of the p-type well region 1051, which is close to the n-type well region 1052. For example, in a CMOS process based on a 0.35-μm rule, an element isolation space of 2 to 3 μm or more must be ensured between the p+-type diffusion layer region 932 and the n+-type diffusion layer region 912. That is, this element isolation space is one of the factors which interfere with a reduction in area of an SRAM cell.

The SOI (Silicon On Insulator) CMOS technique has recently attracted considerable attention as a method of solving the problem posed in the bulk CMOS technique like reference 1. According to the SOI CMOS technique, MOS transistors, diffusion layer regions, and the like are formed on an insulating film and isolated from each other by the insulating film. For this reason, unlike the above bulk CMOS technique, no well structure is required to isolate an n+-type diffusion layer region from a p+-type diffusion layer region. Therefore, when the same potential is to be applied to the n+-type diffusion layer region and the p+-type diffusion layer region, the two regions are formed to be adjacent to each other without being isolated. In addition, when different potentials are to be applied to these diffusion layer regions, the space between the regions can be reduced to the minimum space defined by process conditions.

For example, such an SOI CMOS technique is applied to the CMOS SRAM cell (to be referred to as reference 2 hereinafter) disclosed in Japanese Unexamined Patent Publication No. 62-81055. The CMOS SRAM cell as reference 2 has an SRAM structure in which an n+-type diffusion layer region having NMOS transistors and a p+-type diffusion layer region having PMOS transistors, to which regions the same potential is to be applied, are formed to be adjacent to each other without being isolated by a field oxide film or the like, and are directly connected to each other without using any aluminum interconnection. The CMOS SRAM cell as reference 2 is characterized in that, for example, the n+-type diffusion layer region 912 and the p+-type diffusion layer region 932 in FIG. 2 can be formed to be adjacent to each other and directly connected to each other, and so are the n+-type diffusion layer region 922 and the p+-type diffusion layer region 933 in FIG. 2. In addition, the n+-type diffusion layer regions 911 and 921 and the p+-type diffusion layer region 931 can be arranged at minimum intervals that allow electrical isolation.

The CMOS SRAM cell as reference 2 will be described in detail below with reference to FIGS. 4 and 5. FIGS. 4 and 5 are plan views showing a single-port CMOS SRAM cell circuit implemented on an SOI substrate. FIG. 4 shows how an element region 1210, gate interconnections 1221, 1222 and 1223, contact holes 1280a to 1280i, first aluminum interconnections 1271 and 1272, and second aluminum interconnections 1261 and 1262 are formed. FIG. 5 shows how the element region 1210 and the gate interconnections 1221, 1222, and 1223 are formed.

The gate interconnection 1221 in FIGS. 4 and 5 corresponds to the gates of the NMOS transistors 321 and 322 as the transfer gates in FIG. 6. The gate interconnection 1222 (1223) in FIGS. 4 and 5 corresponds to the gates of the PMOS transistor 301 (302) and the NMOS transistor 311 (312) in FIG. 6.

As shown in FIG. 4, the CMOS SRAM cell circuit as reference 2 is further characterized in that adjacent CMOS SRAM cells share the contact hole 1280a to which the power supply (Vdd) potential is applied, the contact holes 1280b and 1280c to which the ground (Gnd) potential is applied, and the contact holes 1280d and 2180e to which the potentials of signals supplied through the bit lines (the bit lines D and DB in FIG. 6) are applied.

In addition, the CMOS SRAM cell as reference 2 includes the following characteristic feature realized by the SOI CMOS technique. As shown in FIG. 5, the drain diffusion layer of an NMOS transistor (the transistor 311 or 312 in FIG. 6) of a flip-flop and the drain diffusion layer of an NMOS transistor (the transistor 321 or 322 in FIG. 6) as a transfer gate, or an n+-type diffusion layer region 1213 (1216) as a source diffusion layer are arranged to be adjacent to a p+-type diffusion layer region 1212 (1215) as the drain diffusion layer of a PMOS transistor of a flip-flop through a line 1231 (1232) as a boundary. As a result, three diffusion layer regions can be formed as a common diffusion layer with respect to each of the two lines 1231 and 1232, and hence the area of each SRAM cell can be reduced.

The CMOS SRAM cell as reference 2, however, has the following problem.

In the CMOS SRAM cell as reference 2 to which the SOI CMOS technique is applied, the distance between a p⁺-type diffusion layer region and an n⁺-type diffusion layer region and the area of a diffusion layer region constituting a part of the diffusion layer of a MOS transistor of the SRAM cell can be reduced as compared with the SRAM cell as reference 1 to which the bulk CMOS technique is applied. However, the area of each SRAM cell is substantially determined by the contact holes and the aluminum interconnections which are required to connect the nodes of each memory cell and the areas of the diffusion layers of the MOS transistors of each SRAM cell. It is therefore difficult to further reduce the area disclosed in reference 2.

SUMMARY OF THE INVENTION

The present invention has been made in consideration of the above situation of the prior arts, and has as its object to reduce the area of each CMOS SRAM cell using an SOI substrate and provide a semiconductor memory device including a plurality of CMOS SRAM cells which have attained miniaturization.

In order to achieve the above object, according to the first aspect of the present invention, there is provided a CMOS SRAM cell formed on an SOI substrate and comprising a flip-flop having first and second NMOS transistors and first and second PMOS transistors, transfer gates having first and second MOS transistors, and a word line section, wherein the word line section extends along a predetermined direction, wherein source and drain diffusion layer regions of the first and second NMOS transistors and the first and second PMOS transistors are arranged along the predetermined direction, and gates of the transistors are arranged on channel regions thereof in a direction perpendicular to the predetermined direction, wherein the gate of the first NMOS transistor is electrically connected to the gate of the first PMOS transistor, wherein the gate of the second NMOS transistor is electrically connected to the gate of the second PMOS transistor, wherein in a region between the gate of the first NMOS transistor on the channel region and the gate of the first PMOS transistor on the channel region, the drain diffusion layer region of the first NMOS transistor, the drain diffusion layer region of the first PMOS transistor, and one of the drain and source diffusion layer regions of the first MOS transistor are arranged to be adjacent to each other and are electrically connected to each other through a diffusion layer interconnection, and wherein the region between the gate of the second NMOS transistor on the channel region and the gate of the second PMOS transistor on the channel region, the drain diffusion layer region of the second NMOS transistor, the drain diffusion layer region of the second PMOS transistor, and one of the drain and source diffusion layer regions of the second MOS transistor are arranged to be adjacent to each other and are electrically connected to each other through a diffusion layer interconnection.

According to the second aspect of the present invention, the word line section in the first aspect is one word line serving as a gate common to the first and second MOS transistors.

According to the third aspect of the present invention, the word line section in the first aspect is used to input electrically equivalent signals and is constituted by first and second word lines which are electrically isolated from each other in the CMOS SRAM cell, the first word line serving as a gate of the first MOS transistor, and the second word line serving as a gate of the second MOS transistor.

According to the fourth aspect of the present invention, there is provided a semiconductor memory device comprising a plurality of CMOS SRAM cells each described in the first aspect, wherein at least one pair of adjacent CMOS SRAM cells of the plurality of CMOS SRAM cells share the source diffusion layer region of at least one of the first and second NMOS transistors.

According to the fifth aspect of the present invention, there is provided a semiconductor memory device comprising a plurality of CMOS SRAM cells each described in the first aspect, wherein at least one pair of adjacent CMOS SRAM cells of the plurality of CMOS SRAM cells share the source diffusion layer region of at least one of the first and second PMOS transistors.

According to the sixth aspect of the present invention, there is provided a semiconductor memory device comprising a plurality of CMOS SRAM cells each described in the first aspect, wherein at least one pair of adjacent CMOS SRAM cells of the plurality of CMOS SRAM cells share one of the source and drain diffusion layer regions of at least one of the first and second MOS transistors.

According to the seventh aspect of the present invention, there is provided a semiconductor memory device comprising a CMOS SRAM cell formed on an SOI substrate and including a flip-flop, a transfer gate, and at least one word line, wherein MOS transistors in the CMOS SRAM cell are arranged along an interconnection direction of a gate as the word line, wherein all gates of the MOS transistors in the CMOS SRAM cell are arranged in a direction perpendicular to the interconnection direction of the gate as the word line, and wherein in a region between gates of PMOS and NMOS transistors electrically connected to each other, of all gates of the MOS transistors arranged in the direction perpendicular to the interconnection direction of the gate as the word line, a drain diffusion layer region of the PMOS transistor, a drain diffusion layer region of the NMOS transistor, and a drain or source diffusion layer region of a MOS transistor of the transfer gate are electrically connected to each other through a diffusion layer interconnection.

According to the present invention, in a CMOS SRAM cell formed on an SOI substrate and including a flip-flop and transfer gates, the area of a diffusion layer region including the drain diffusion layers of the respective PMOS and NMOS transistors constituting the flip-flop and the source or drain diffusion layer region of each MOS transistor serving as the transfer gate can be reduced, thereby attaining a reduction in overall area of the CMOS SRAM cell.

The above and many other objects, features and additional advantages of the present invention will become manifest to those versed in the art upon making reference to the following detailed description and accompanying drawings in which preferred embodiments incorporating the principles of the present invention are shown by way of illustrative examples.

DETAILED DESCRIPTION OF THE PREFERRED EMBODIMENTS

Several preferred embodiments of the present invention will be described below with reference to the accompanying drawings.

Figure 6:
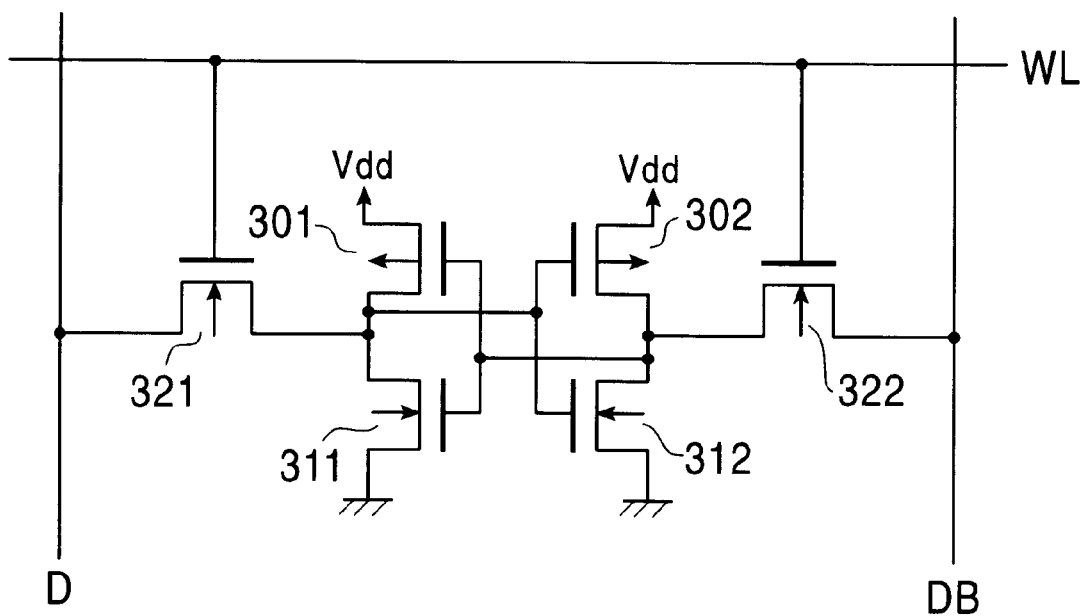
FIG. 6 is a circuit diagram showing a conventional, general single-port CMOS SRAM cell.

In each embodiment described below, the CMOS SRAM cell circuit shown in FIG. 6 is implemented on the SOI substrate. The layout of this circuit will be mainly described below.

A CMOS SRAM cell according to the first embodiment of the present invention will be described below with reference to FIGS. 7 and 8.

Figure 7:
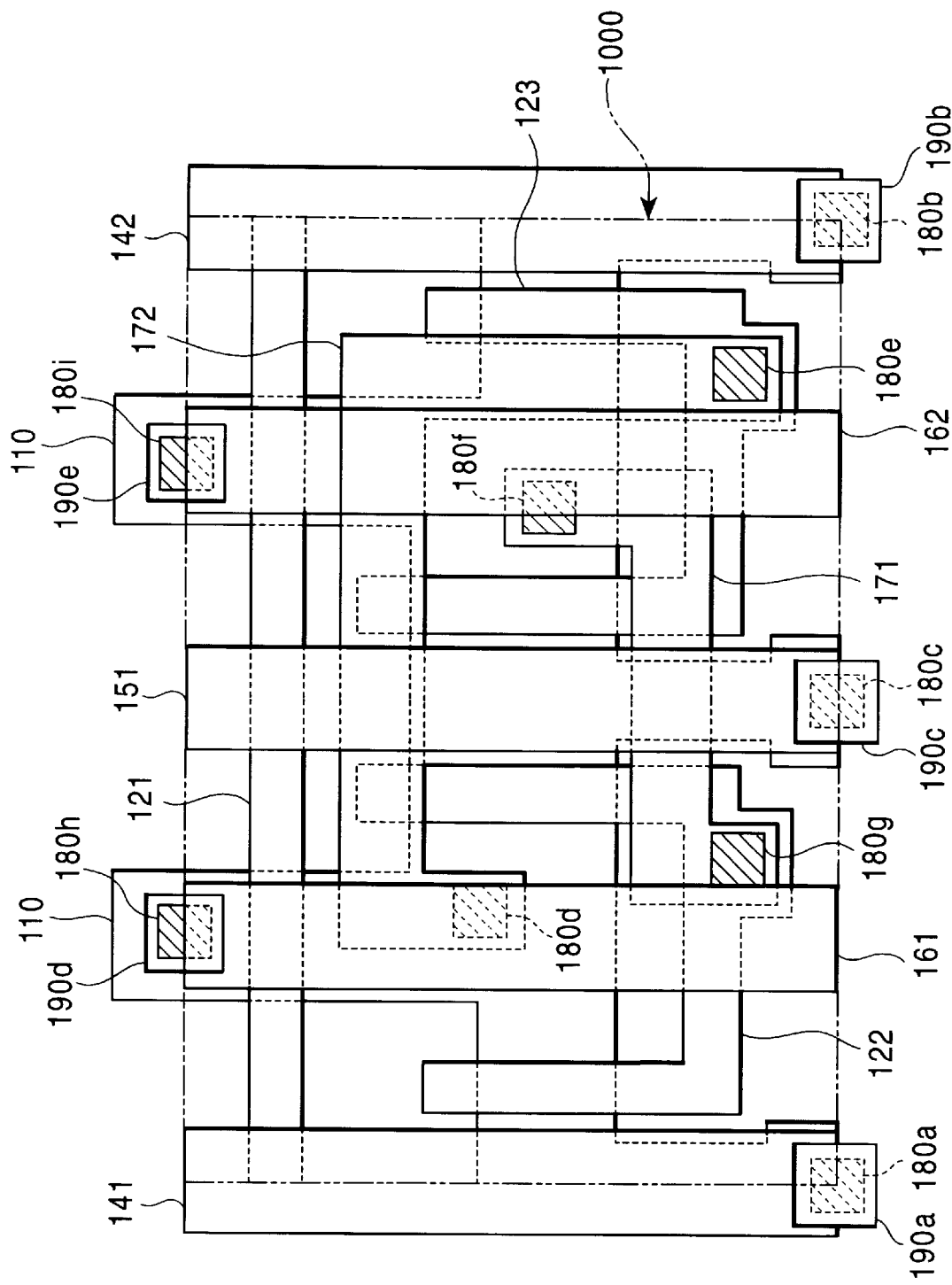
FIG. 7 is a plan view showing the structure of a CMOS SRAM cell according to the first embodiment of the present invention.

AS shown in FIG. 7, the CMOS SRAM cell of this embodiment includes an element region 110, gate interconnections 121, 122, and 123, contact holes 180a to 180i, first aluminum interconnections 171 and 172, through holes 190a to 190e, and second aluminum interconnections 141, 142, 151, 161, and 162. The CMOS SRAM cell is formed on an SOI substrate. FIG. 8 shows the element region 110 and the gate interconnections 121, 122, and 123 in FIG. 7. The arrangement of the MOS transistors in FIG. 7 can be understood from FIG. 8. As is obvious from FIGS. 7 and 8, three pairs of MOS transistors respectively using the gate interconnections 121, 122, and 123 as gates are formed in the CMOS SRAM cell of the first embodiment. That is, one CMOS SRAM cell includes a total of six CMOS transistors.

Of the MOS transistors each using the gate interconnection 122 as a gate, the PMOS transistor having $p^+$-type diffusion layer regions 111 and 112 as a source and a drain, respectively, corresponds to the PMOS transistor 301 in FIG. 6, and the NMOS transistor having $n^+$-type diffusion layer regions 118 and 113 as a source and a drain, respectively, corresponds to the NMOS transistor 311 in FIG. 6. Similarly, of the MOS transistors each using the gate interconnection 123 as a gate, the PMOS transistor having $p^+$-type diffusion layer regions 119 and 115 as a source and a drain, respectively, corresponds to the PMOS transistor 302 in FIG. 6, and the NMOS transistor having the $n^+$-type diffusion layer region 118 and an $n^+$-type diffusion layer region 116 as a source and a drain, respectively, corresponds to the NMOS transistor 312 in FIG. 6. Of the MOS transistors each using the gate interconnection 121 as a gate, the NMOS transistor having the $n^+$-type diffusion layer region 113 and an $n^+$-type diffusion layer region 114 as a source and a drain, and vice versa, respectively, corresponds to the NMOS transistor 321 in FIG. 6, and the NMOS transistor having the $n^+$-type diffusion layer region 116 and an $n^+$-type diffusion layer region 117 as a source and a drain, and vice versa, respectively, corresponds to the NMOS transistor 322 in FIG. 6. Note that the NMOS transistors 321 and 322 in FIG. 6 are expressed in the this manner because the sources and drains of these transistors cannot be specified, and no problem is posed in terms of implementation.

The second aluminum interconnections 141 and 142 in FIG. 7 are power supply (Vdd) interconnections, and the second aluminum interconnection 151 is a ground (Gnd) interconnection. The $p^+$-type diffusion layer regions 111 and 119 in FIG. 8 are respectively connected to the second aluminum interconnections 141 and 142 through the contact holes 180a and 180b and the through holes 190a and 190b. With this structure, the Vdd potential is applied to the $p^+$-type diffusion layer regions 111 and 119. The $n^+$-type diffusion layer region 118 in FIG. 8 is connected to the second aluminum interconnection 151 as a ground interconnection through the contact hole 180c and the through hole 190c. With this structure, the Gnd potential is applied to the $n^+$-type diffusion layer region 118.

Figure 8:
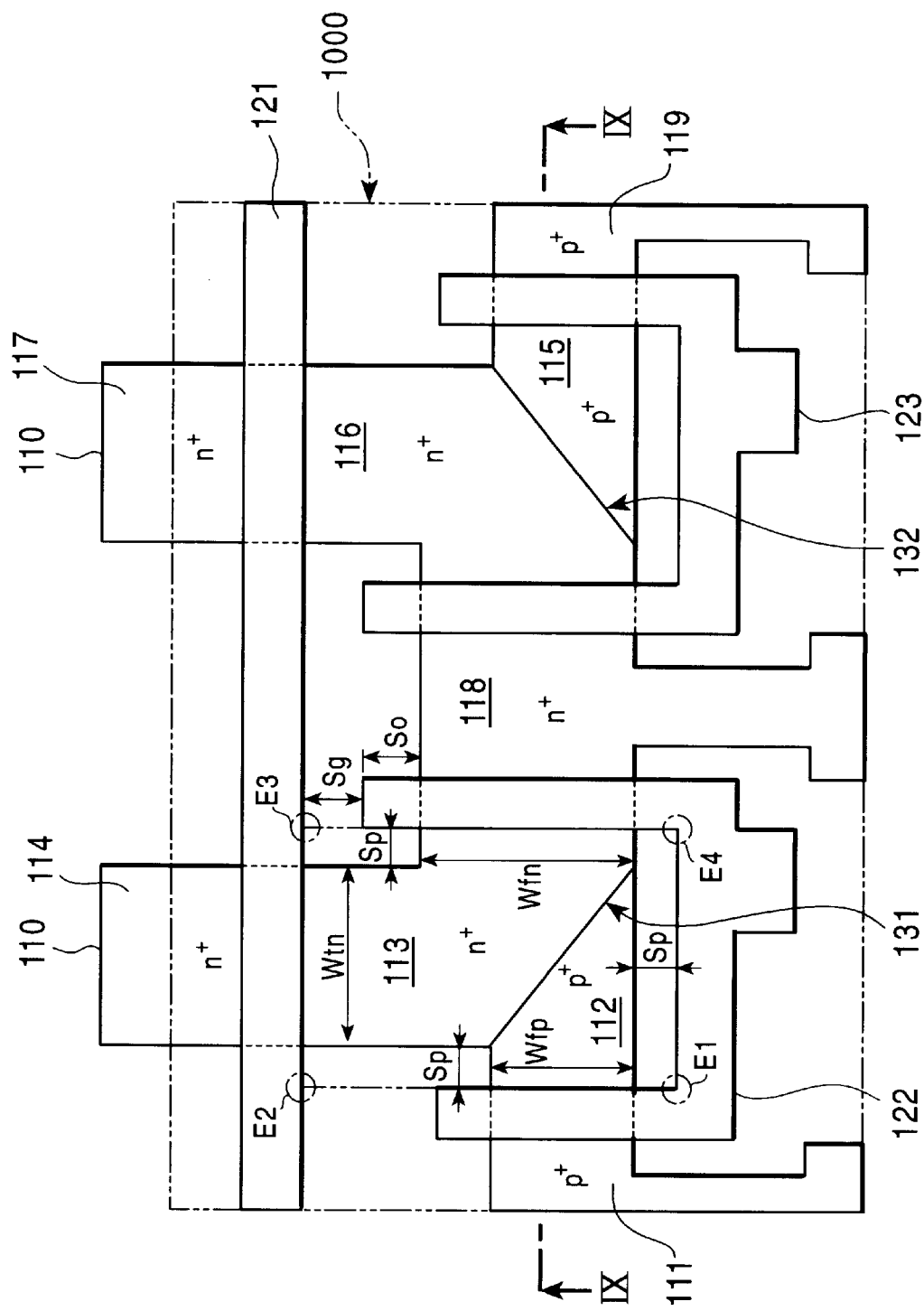
FIG. 8 is a plan view showing the relationship between the element regions and the gate interconnections in the first embodiment of the present invention.

Referring to FIGS. 7 and 8, the $p^+$-type diffusion layer region 112 and the $n^+$-type diffusion layer region 113 are formed to be adjacent to each other through a line 131 as a boundary. The diffusion layer region constituted by the $p^+$-type diffusion layer region 112 and the $n^+$-type diffusion layer region 113 is connected to the gate interconnection 123 through the first aluminum interconnection 172 and the contact holes 180d and 180e in FIG. 7. Similarly, the $p^+$-type diffusion layer region 115 and the $n^+$-type diffusion layer region 116 are formed to be adjacent to each other through a line 132 as a boundary, thereby forming one diffusion layer region. In addition, the diffusion layer region constituted by the $p^+$-type diffusion layer region 115 and the $n^+$-type diffusion layer region 116 is connected to the gate interconnection 122 through the first aluminum interconnection 171 and the contact holes 180f and 180g. With this connection, the PMOS transistors 301 and 302 and the NMOS transistors 311 and 312 constitute a flip-flop.

The second aluminum interconnections 161 and 162 in FIG. 7 correspond to the bit lines D and DB in FIG. 6. The gate interconnection 121 corresponds to the word line WL in FIG. 6. The $n^+$-type diffusion layer regions 114 and 117 in FIG. 8 are respectively connected to the second aluminum interconnections 161 and 162 as the bit lines D and DB through the contact holes 180h and 180i and the through holes 190d and 190e.

As is obvious from FIGS. 7 and 8, the MOS transistors constituting each flip-flop are arranged such that the respective gates extend on the respective channel regions in a direction perpendicular to the direction in which the gate interconnection 121 as the word line WL extends. The MOS transistors constituting each flip-flop are also arranged such that the respective source and drain diffusion layer regions extend along the direction in which the gate interconnection 121 as the word line WL extends.

Figure 9:
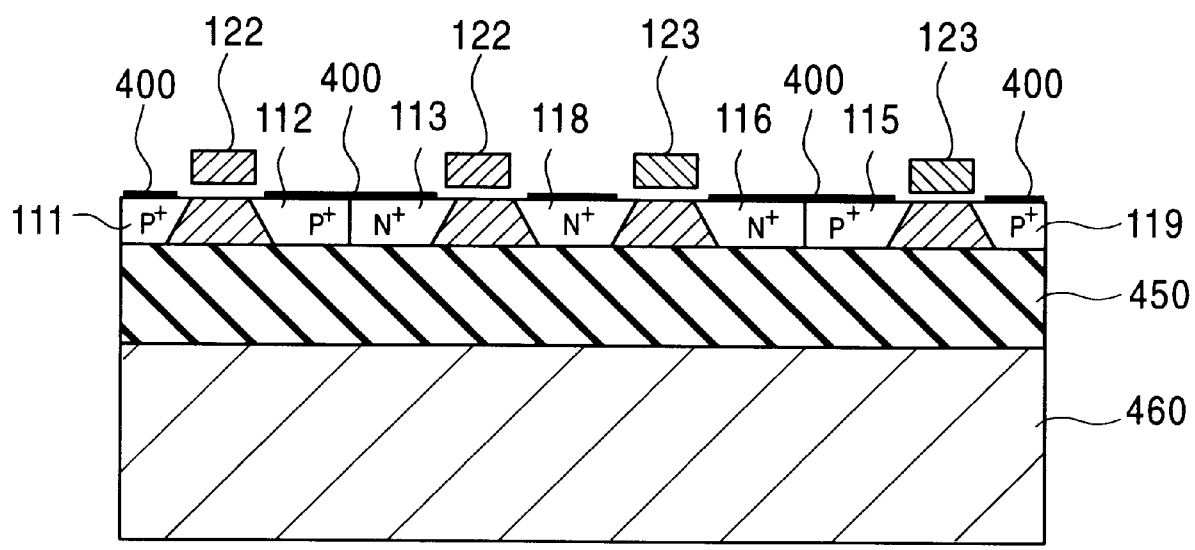
FIG. 9 is a sectional view taken along a line IX—IX in FIG. 8.

The cross-sectional structure of the CMOS SRAM cell of the first embodiment will be described next with reference to FIG. 9. FIG. 9 shows the cross-section designated in FIG. 8. FIG. 9 is a sectional view showing four MOS transistors constituting a flip-flop in the SRAM cell.

Figure 1:
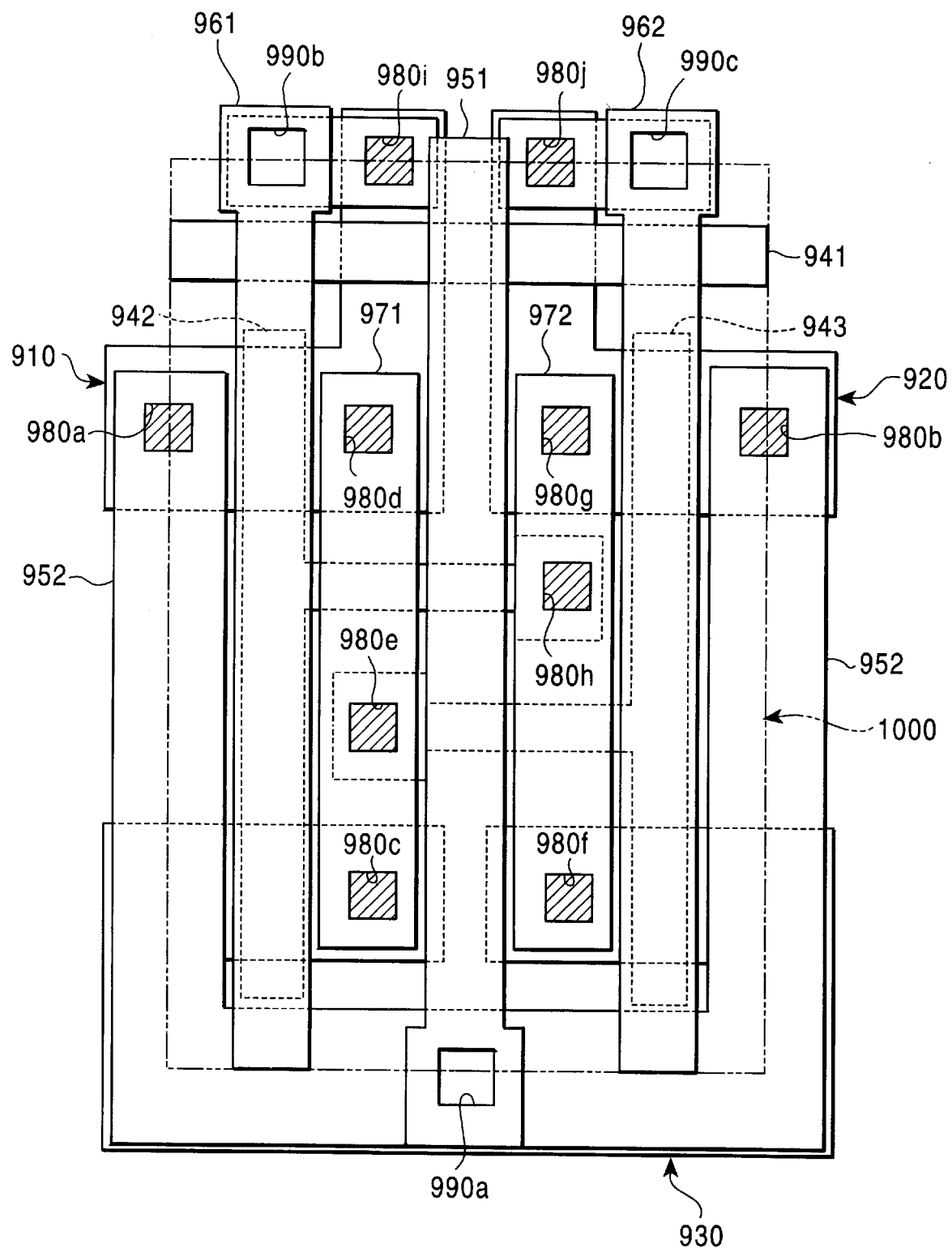
FIG. 1 is a plan view showing the structure of a CMOS SRAM cell as reference 1.
Figure 2:
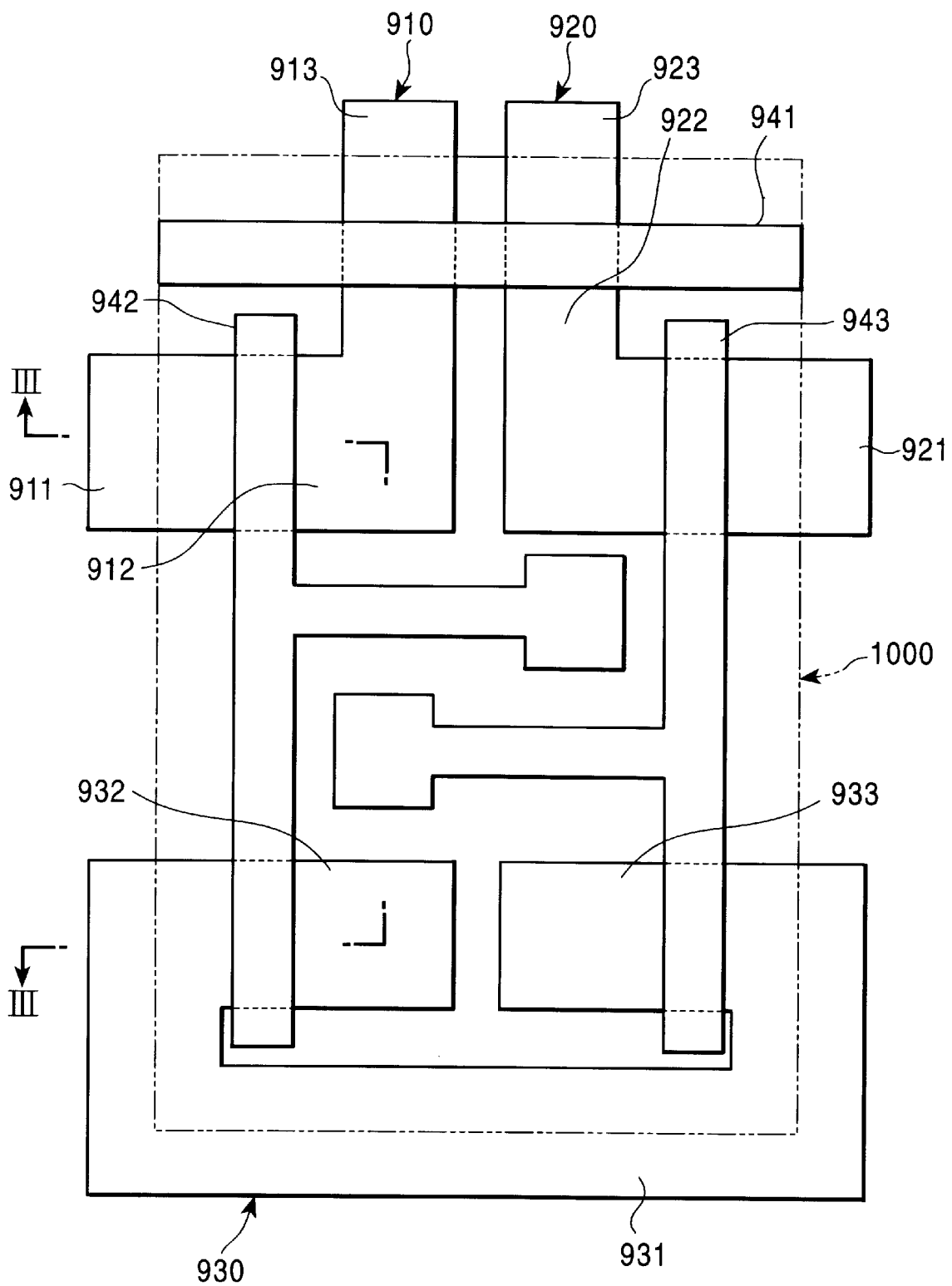
FIG. 2 is a plan view showing the relationship between the element regions and the gate interconnections in reference 1.
Figure 3:
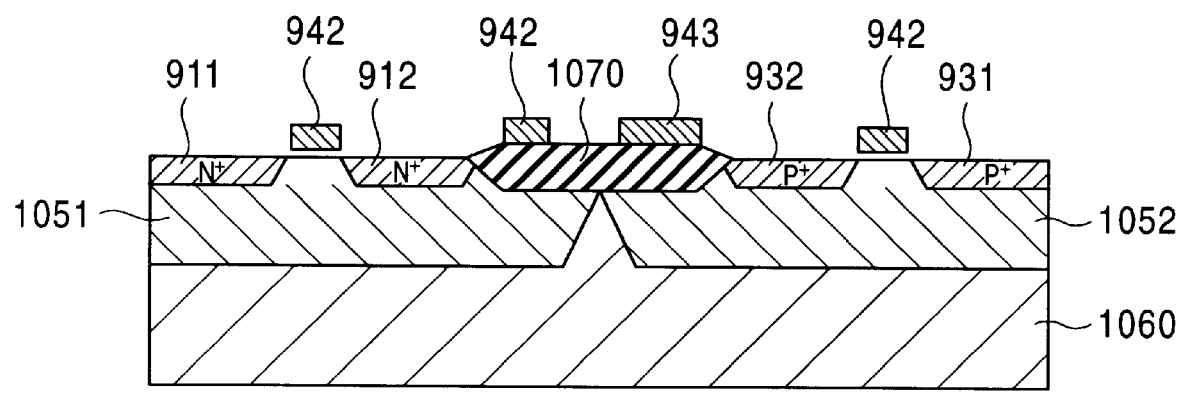
FIG. 3 is a sectional view taken along a line III—III in FIG. 2.
Figure 4:
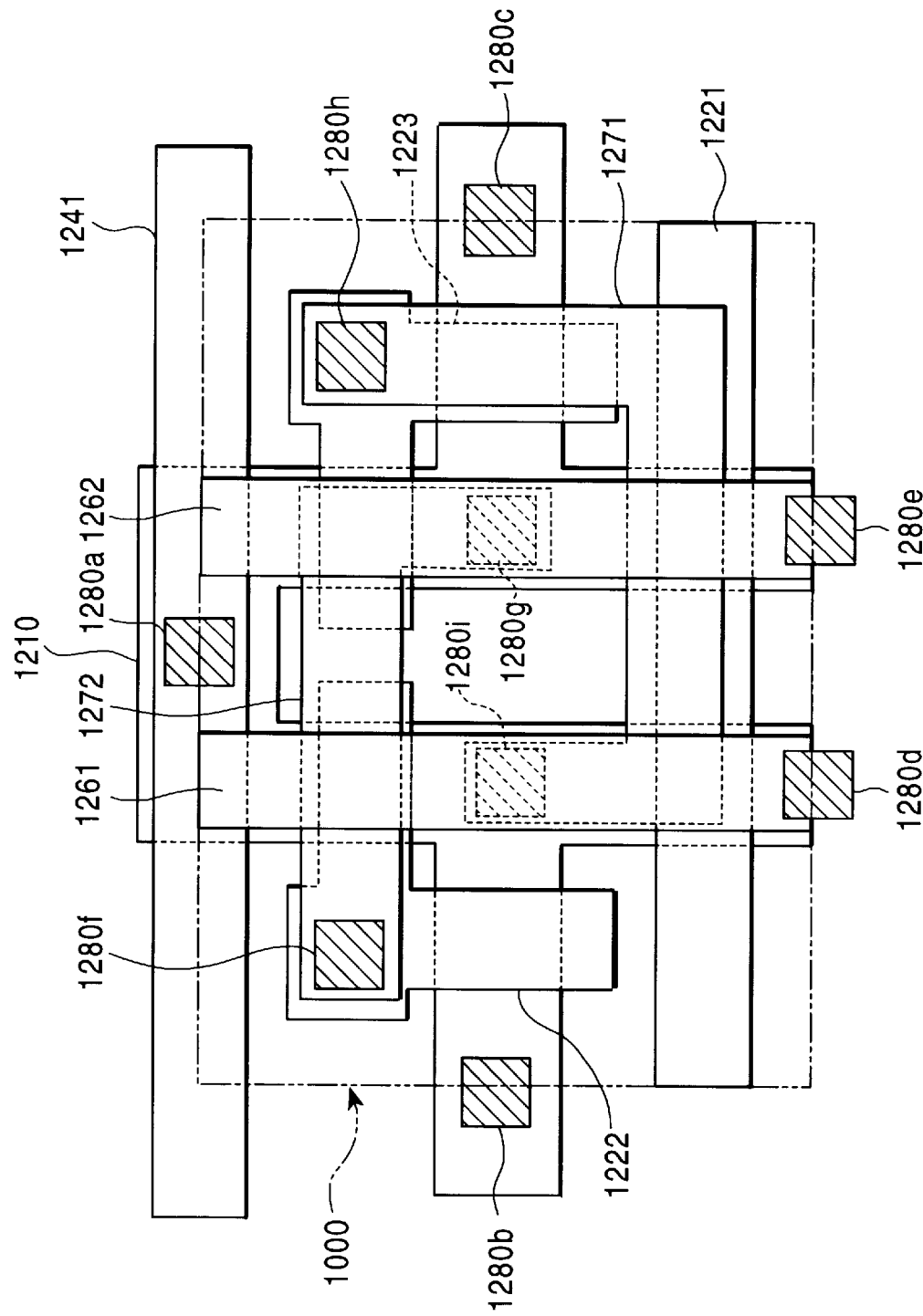
FIG. 4 is a plan view showing the structure of a CMOS SRAM cell as reference 2.

As shown in FIG. 9, the MOS transistors manufactured by using the SOI technique are formed on a buried oxide film 450 on a p-type substrate (p-Sub) 460. In this case, the buried oxide film 450 as an insulator and the semiconductor layer on which the MOS transistors are formed will be generally termed an SOI substrate. On the SOI substrate, the respective elements are formed on the insulator, and hence are electrically isolated from each other. More specifically, in this embodiment, the p$^+$-type diffusion layer region 112 of the PMOS transistor is electrically isolated from the n$^+$-type diffusion layer regions 116 and 118 of the NMOS transistor by the buried oxide film 450. Similarly, the p$^+$-type diffusion layer region 115 of the PMOS transistor is electrically isolated from the n$^+$-type diffusion layer regions 113 and 118 of the NMOS transistor by the buried oxide film 450. An SOI device to which the SOI technique is applied in this manner does not require any well for electrically isolating the respective elements. In addition, the field oxide film 1070 for element isolation, which is described in association with reference 1 with reference to FIG. 3, need not be formed between the p$^+$-type diffusion layer region 112 and the n$^+$-type diffusion layer region 113 and between the p$^+$-type diffusion layer region 115 and the n$^+$-type diffusion layer region 116. That is, the p$^+$-type diffusion layer region 112 and the n$^+$-type diffusion layer region 113 can be formed to be adjacent to each other, and so are the p$^+$-type diffusion layer region 115 and the n$^+$-type diffusion layer region 116. In this embodiment, a silicide layer 400 is formed as a conductor on the surface of each diffusion layer region to electrically connect the p$^+$-type diffusion layer region 112 to the n$^+$-type diffusion layer region 113, and connect the p$^+$-type diffusion layer region 115 to the n$^+$-type diffusion layer region 116.

Figure 10:
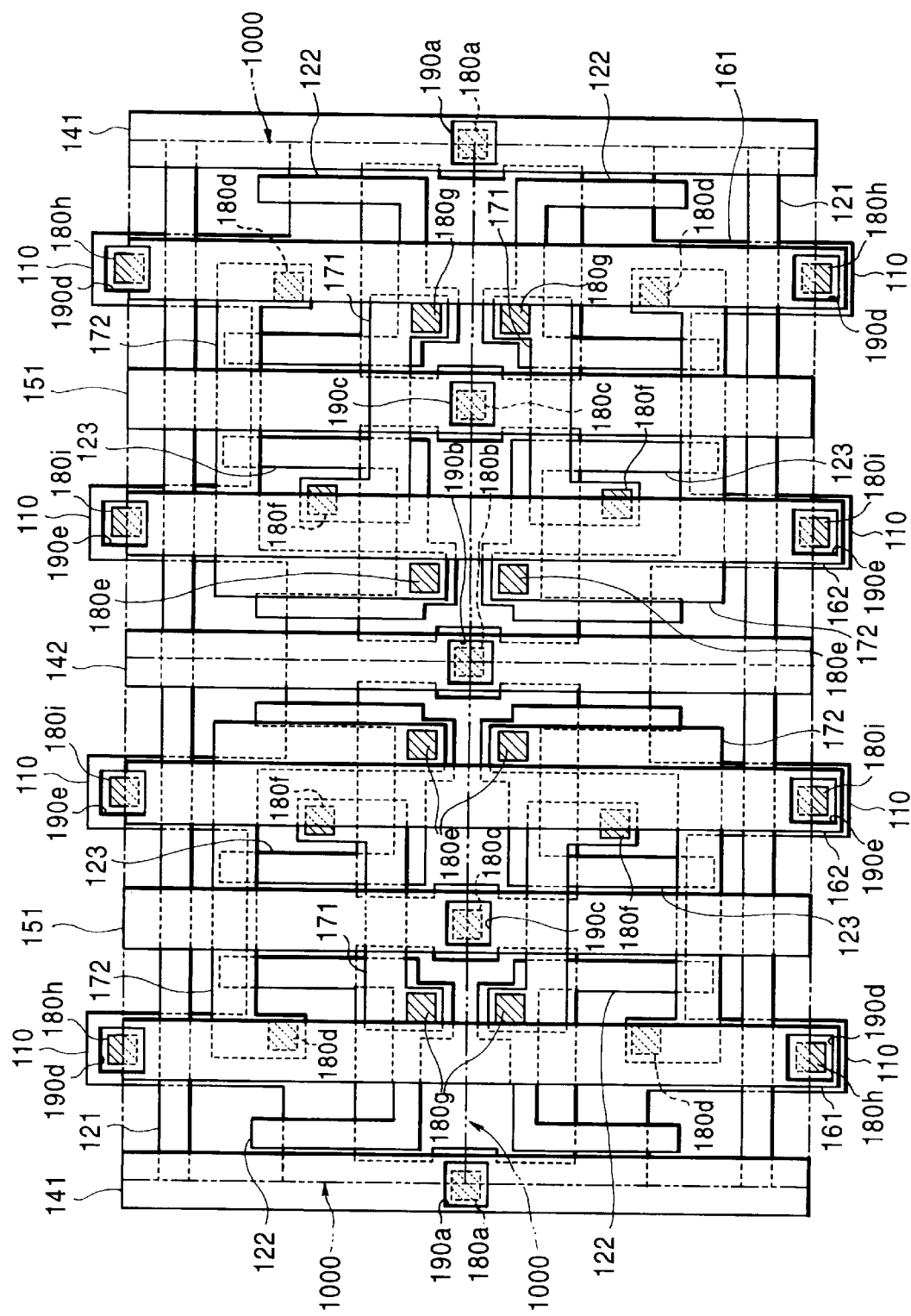
FIG. 10 is a plan view showing a structure in which CMOS SRAM cells according to the first embodiment of the present invention are arranged in the form of a 2×2 matrix.

A structure in which the above CMOS SRAM cells are arranged in the form of a 2×2 matrix along cell boundary lines 1000. In the first embodiment, as shown in FIG. 10, when an arbitrary CMOS SRAM cell is regarded as a reference cell, a CMOS SRAM cell placed on either the right or left side of the reference cell has a laterally reversed layout relative to the layout of the reference cell. Similarly, a CMOS SRAM cell placed on either the upper or lower side of the reference cell has a vertically reversed layout relative to the layout of the reference cell, and a CMOS SRAM cell placed at any oblique position with respect to the reference cell has a vertically and laterally reversed layout relative to the layout of the reference cell. Obviously, this structure should be regarded as an example in this embodiment, and the concept of the present invention is not limited to this.

Referring to FIG. 10, the second aluminum interconnections 141 and 142 are shared between the adjacent CMOS SRAM cells and serve as common power supply interconnections. The contact hole 180a or 180b for applying the Vdd potential to the p$^+$-type diffusion layer region 111 or 119 is located at a position on the second aluminum interconnection 141 or 142 which corresponds to the boundary between four adjacent SRAM cells. That is, the p$^+$-type diffusion layer region connected to the power supply interconnection is common to the four adjacent SRAM cells. The through hole 190a or 190e and the contact hole 180h or 180i which are formed to connect the second aluminum interconnection 161 or 162 corresponding to the bit line D or DB to the diffusion layer of the NMOS transistor serving as the transfer gate are located at a position corresponding to the boundary between the two CMOS SRAM cells adjacent to each other in the vertical direction. That is, the n$^+$-type diffusion layer region electrically connected to the bit line D or DB is common to the CMOS SRAM cells adjacent to each other in the vertical direction. In the first embodiment, the diffusion layer regions electrically connected to the power supply lines and the bit lines D and DB are shared between the adjacent CMOS SRAM cells to reduce the area of each cell.

The effect of the first embodiment will be described below by comparing the area of a rectangular region E1-E2-E3-E4, which includes the diffusion layer in which the p$^+$-type diffusion layer region 112 and the n$^+$-type diffusion layer region 113 shown in FIG. 8 are formed, with the area of the corresponding region of the SRAM cell as reference 2 described above.

Referring to FIG. 8, letting Wtn be the transistor width of the NMOS transistor 321 serving as a transfer gate in FIG. 6, and Wfp and Wfn be the transistor widths of the PMOS transistor 301 and the NMOS transistor 311 which constitute the flip-flop, the transistor widths Wtn, Wfp, and Wfn generally have the following relationship:

$$Wfn > Wtn > Wfp \qquad (1)$$

Referring to FIG. 8, letting Sp be the space between the diffusion layer region and the gate interconnection, Sg be the space between the gate interconnections, So be the overlap of the end portion of the gate interconnection with respect to the diffusion layer region, and Sa be the area of the rectangular region E1-E2-E3-E4 in FIG. 8, the area Sa is given by $$Sa = (Wtn + 2Sp) \times (Wfn + Sp + So + Sg) \qquad (2)$$

Figure 5:
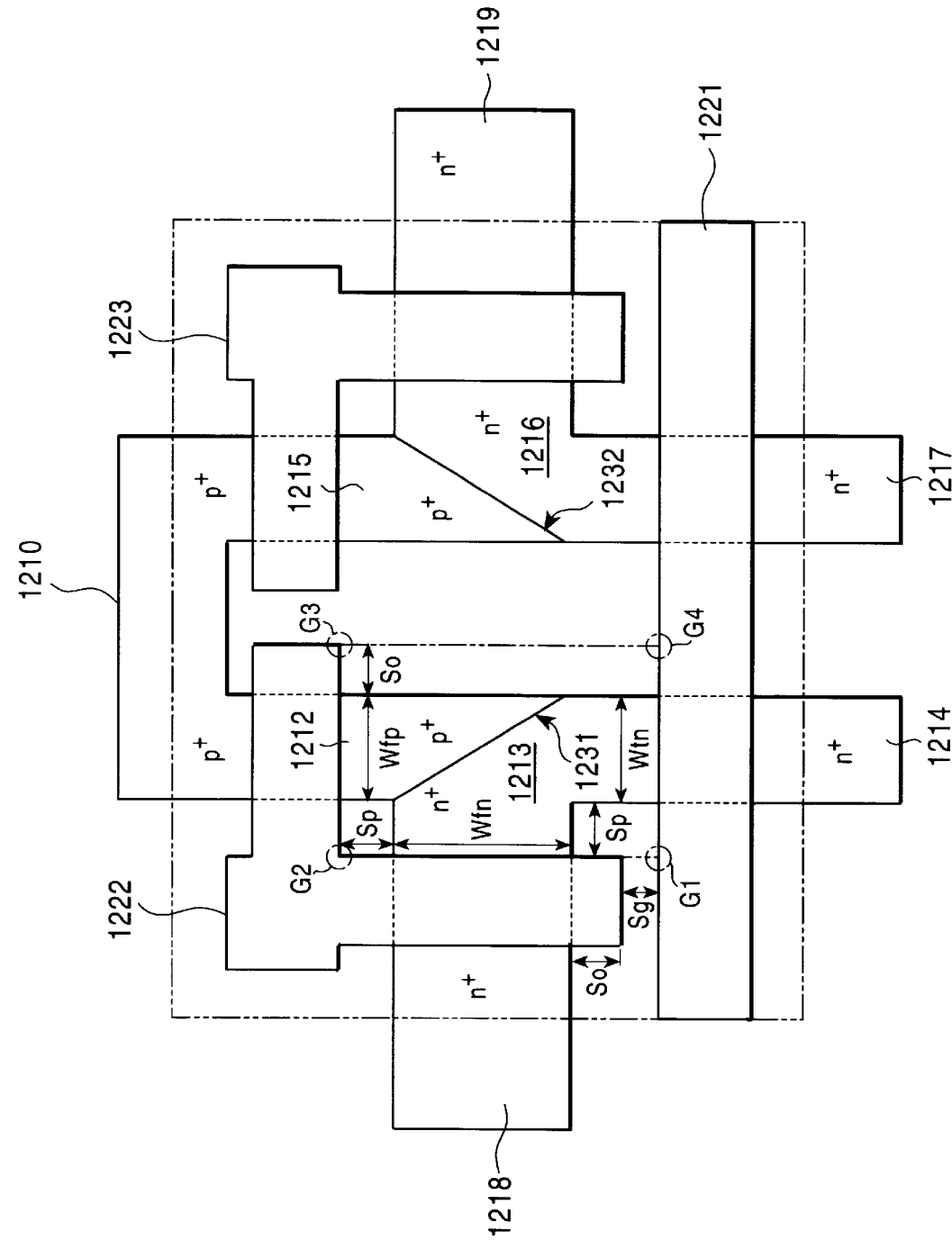
FIG. 5 is a plan view showing the relationship between the element regions and the gate interconnections in reference 2.

Letting Sb be the area of a rectangular region G1-G2-G3-G4, in the CMOS SRAM cell as reference shown in FIG. 5, which corresponds to the area Sa, the area Sb is given by $$Sb = (Wtn + Sp + So) \times (Wtn + Sp + So + Sg) \qquad (3)$$

A difference Sa−Sb between the area Sa and the area Sb given by equations (2) and (3) is calculated by $$Sa - Sb = (Sp - So) \times (Wfn + Sp + So + Sg) \qquad (4)$$

In this case, the space Sp between the diffusion layer region and the gate interconnection almost corresponds to the guaranteed positioning precision between the element region pattern and the gate interconnection pattern. In contrast to this, the overlap So of the end portion of the gate interconnection with respect to the diffusion layer region is set to a value obtained by adding a margin to the above positioning precision so as to prevent the geometric offset between the layout data and the actual gate interconnection, which is caused at the end portion of the gate interconnection, from affecting the transistor characteristics. In general, therefore, the space Sp between the diffusion layer region and the gate interconnection and the overlap So of the end portion of the gate interconnection with respect to the diffusion layer region satisfy the following relation:

$$So > Sp \qquad (5)$$

According to equation (4) and inequality (5), the area Sa and the area Sb satisfy the following relation:

Sa<Sb (6)

As is obvious from inequality (6), the rectangular area of the CMOS SRAM cell of the first embodiment is smaller than that of reference 2.

Assume that the CMOS SRAM cells according to the first embodiment and reference 2 are manufactured by a CMOS process technique based on a 0.35-μm rule. In this case, the area Sa is about 20% smaller than the area Sb. The overall area of the SRAM cell of the first embodiment is about 4% smaller than that of reference 2.

As described above, according to the SRAM cell of the first embodiment, the MOS transistors constituting the flip-flop are arranged on the SOI substrate in the word line direction. In addition, in the first embodiment, all the gates of the MOS transistors constituting the flip-flop extend on the respective channel regions in a direction perpendicular to the word line direction. In the first embodiment, in the region between the gates of the PMOS and NMOS transistors electrically connected to each other, of the gates of the MOS transistors constituting the flip-flop, the drain diffusion layer regions of the PMOS and NMOS transistors are connected to the drain or source diffusion layer region of the MOS transistor serving as a transfer gate through the diffusion layer interconnection. With this structure, in the first embodiment, the regions connected to each other through the above diffusion layer interconnection can be formed to have an area smaller than that of reference 2. As a result, a reduction in overall area of the SRAM cell of the first embodiment can be attained.

A CMOS SRAM cell according to the second embodiment will now be described with reference to FIGS. 11 and 12.

Figure 11:
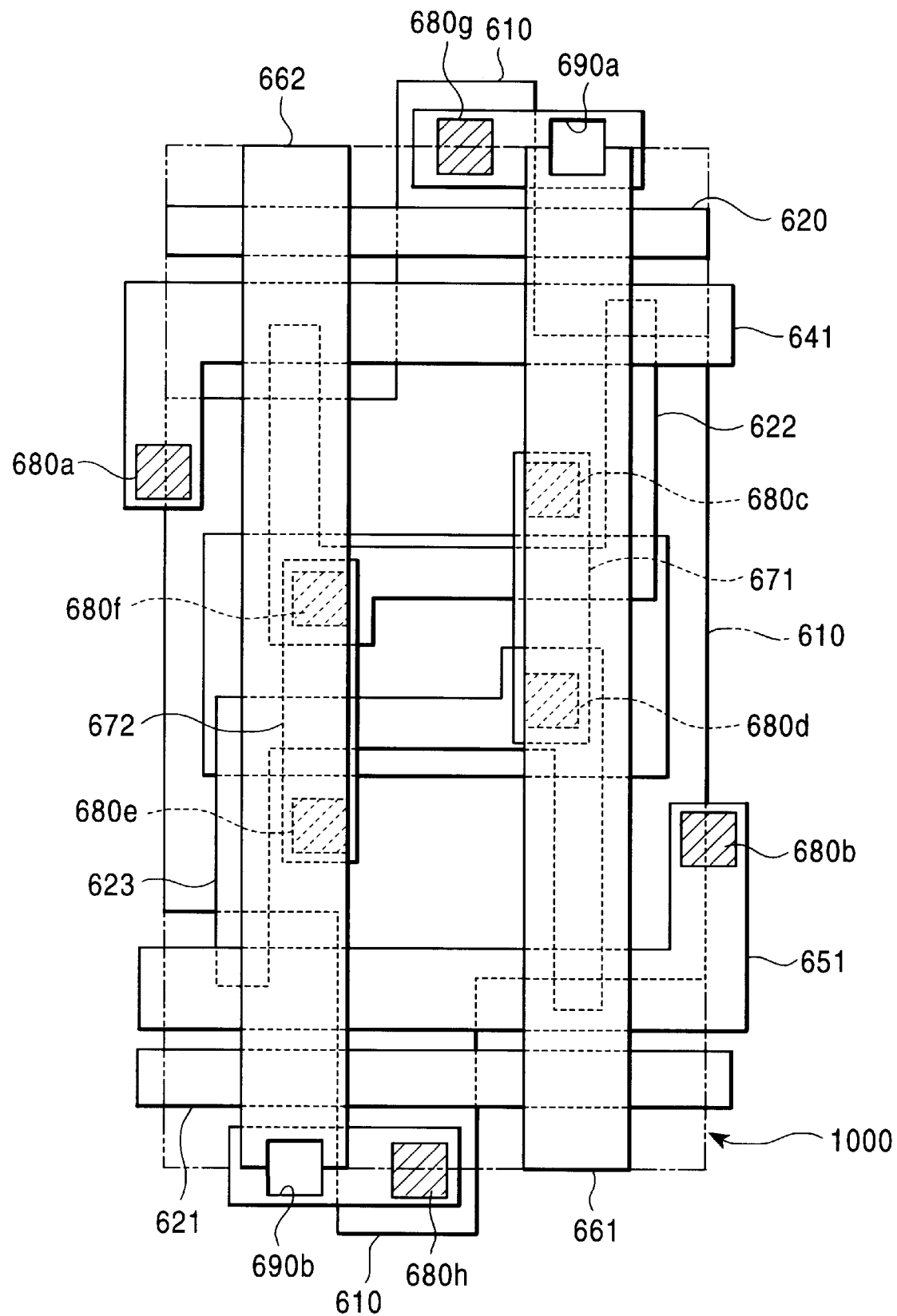
FIG. 11 is a plan view showing the structure of a CMOS SRAM cell according to the second embodiment of the present invention.

As shown in FIG. 11, the CMOS SRAM cell of the second embodiment includes an element region 610, gate interconnections 620, 621, 622, and 623, contact holes 680a to 680h, first aluminum interconnections 641, 651, 671, and 672, through holes 690a and 690b, and second aluminum interconnections 661 and 662. The CMOS SRAM cell is formed on an SOI substrate. FIG. 12 shows the element region 610 and the gate interconnections 620, 621, 622, and 623 in FIG. 11 and the arrangement of the MOS transistors in FIG. 11. As is obvious from FIGS. 11 and 12, in the CMOS SRAM cell of the second embodiment, two MOS transistors respectively using the gate interconnections 620 and 621 as gates, and two pairs of MOS transistors respectively using the gate interconnections 622 and 623 as gates are formed. That is, one CMOS SRAM cell includes a total of six MOS transistors.

In this case, the gate interconnections 620 and 621 correspond to the word line WL in FIG. 6. Although these interconnections are not connected to each other in FIG. 11, they are electrically equivalent to each other. Of the MOS transistors each using the gate interconnection 622 as a gate, the PMOS transistor having p$^+$-type diffusion layer regions 611 and 612 as a source and a drain, respectively, corresponds to the PMOS transistor 301 in FIG. 6, and the NMOS transistor having n$^+$-type diffusion layer regions 618 and 613 as a source and a drain, respectively, corresponds to the NMOS transistor 311 in FIG. 6. Similarly, of the MOS transistors each using the gate interconnection 623 as a gate, the PMOS transistor having the p$^+$-type diffusion layer region 611 and a p$^+$-type diffusion layer region 615 as a source and a drain, respectively, corresponds to the PMOS transistor 302 in FIG. 6, and the NMOS transistor having n$^+$-type diffusion layer regions 118 and 116 as a source and a drain, respectively, corresponds to the NMOS transistor 312 in FIG. 6. The NMOS transistor using the gate interconnection 620 as a gate and having the n$^+$-type diffusion layer region 613 and an n$^+$-type diffusion layer region 614 as a source and a drain, and vice versa, respectively, corresponds to the NMOS transistor 321 in FIG. 6. The NMOS transistor using the gate interconnection 621 as a gate and having n$^+$-type diffusion layer regions 616 and 617 as a source and a drain, and vice versa, respectively, corresponds to the NMOS transistor 322 in FIG. 6. Note that the NMOS transistors 321 and 322 in FIG. 6 are expressed in the this manner because the sources and drains of these transistors cannot be specified, and no problem is posed in terms of implementation, as in the first embodiment.

The first aluminum interconnection 641 in FIG. 11 is a power supply (Vdd) interconnection. The first aluminum interconnection 651 is a ground (Gnd) interconnection. The p$^+$-type diffusion layer region 611 in FIG. 12 is connected to the first aluminum interconnection 641 as the power supply interconnection through the contact hole 680a. With this structure, the Vdd potential is applied to the p$^+$-type diffusion layer region 611. The n$^+$-type diffusion layer region 618 in FIG. 12 is connected to the first aluminum interconnection 651 as the ground interconnection through the contact hole 680b. With this structure, the Gnd potential is applied to the n$^+$-type diffusion layer region 618.

Figure 12:
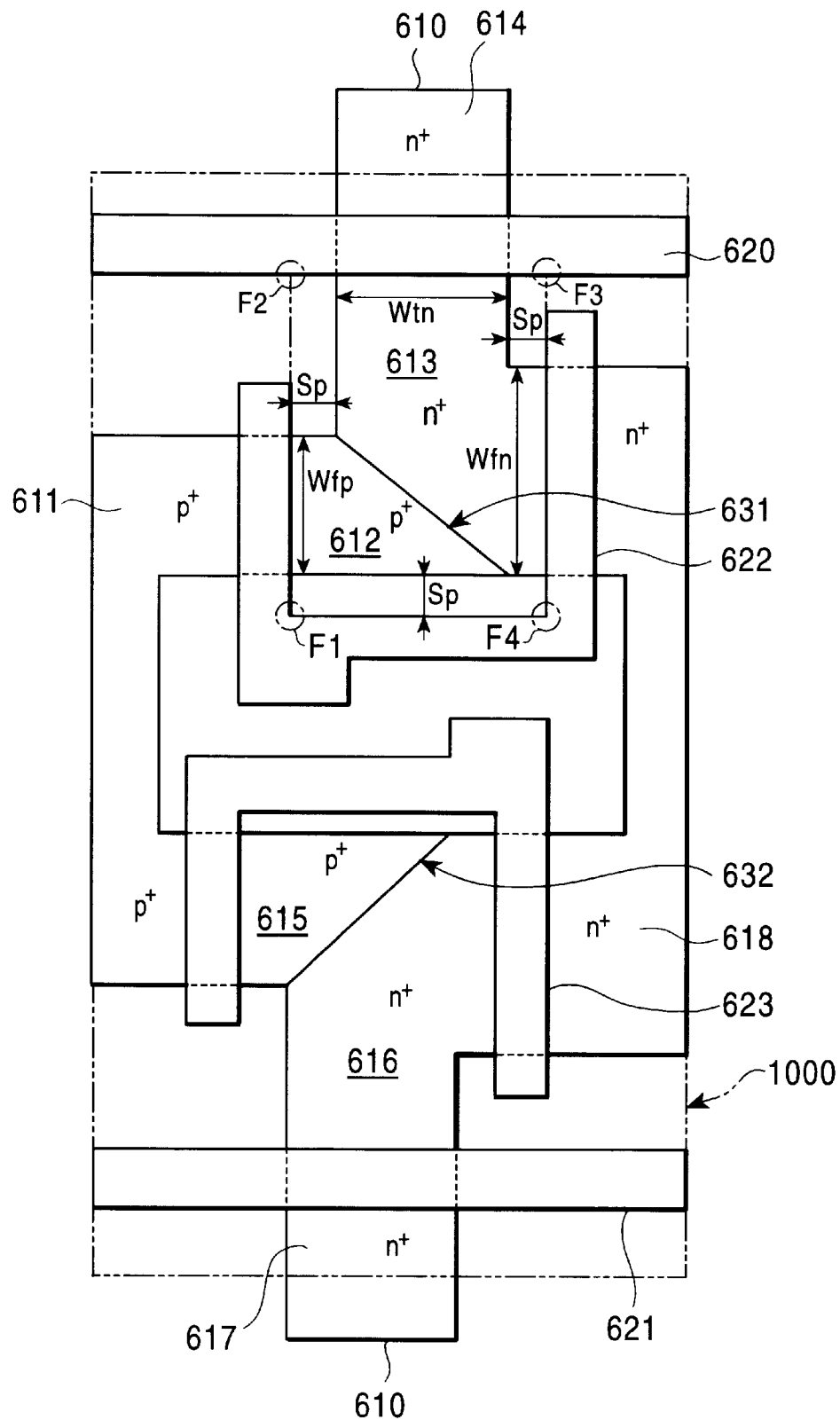
FIG. 12 is a plan view showing the relationship between the element regions and the gate interconnections in the second embodiment of the present invention.

Referring to FIGS. 11 and 12, the p$^+$-type diffusion layer region 612 and the n$^+$-type diffusion layer region 613 are formed to be adjacent to each other through a line 631 as a boundary so as to form one diffusion layer region. The diffusion layer region constituted by the p$^+$-type diffusion layer region 612 and the n$^+$-type diffusion layer region 613 is connected to the gate interconnection 623 through the first aluminum interconnection 671 and the contact holes 680c and 680d. Similarly, the p$^+$-type diffusion layer region 615 and the n$^+$-type diffusion layer region 616 are formed to be adjacent to each other through a line 632 as a boundary so as to constitute one diffusion layer region. The diffusion layer region constituted by the p$^+$-type diffusion layer region 615 and the n$^+$-type diffusion layer region 616 is connected to the gate interconnection 622 through the first aluminum interconnection 672 and the contact holes 680e and 680f. With this connection, the PMOS transistors 301 and 302 and the NMOS transistors 311 and 312 in FIG. 6 constitute a flip-flop.

The second aluminum interconnections 661 and 662 in FIG. 11 correspond to the bit lines D and DB in FIG. 6. The gate interconnection 621 corresponds to the word line WL in FIG. 6. The n$^+$-type diffusion layer region 614 or 617 is connected to the second aluminum interconnection 661 or 662 as the bit line D or DB through the contact hole 680g or 680h and the through hole 690a or 690b.

As is obvious from FIGS. 11 and 12, the MOS transistors constituting the flip-flop are arranged such that the respective gates extend on the respective channel regions in a direction perpendicular to the direction in which the two gate interconnections 621 and 622 as the word lines WL extend. In addition, the MOS transistors constituting the flip-flop are arranged such that the respective source and drain diffusion layer regions are formed along the direction in which the gate interconnections 621 and 622 as the word lines WL extend.

In the second embodiment, as in the first embodiment, the p$^+$-type diffusion layer region 612, the n$^+$-type diffusion layer region 613, the p$^+$-type diffusion layer region 615, and the n$^+$-type diffusion layer region 616 are arranged to be adjacent to each other through the lines 631 and 632 as boundaries. A silicide layer is formed on the surface of each diffusion layer region to electrically connect the p$^+$-type diffusion layer region 612, the n+-type diffusion layer region 613, the p+-type diffusion layer region 615, and the n+-type diffusion layer region 616 to each other.

Figure 13:
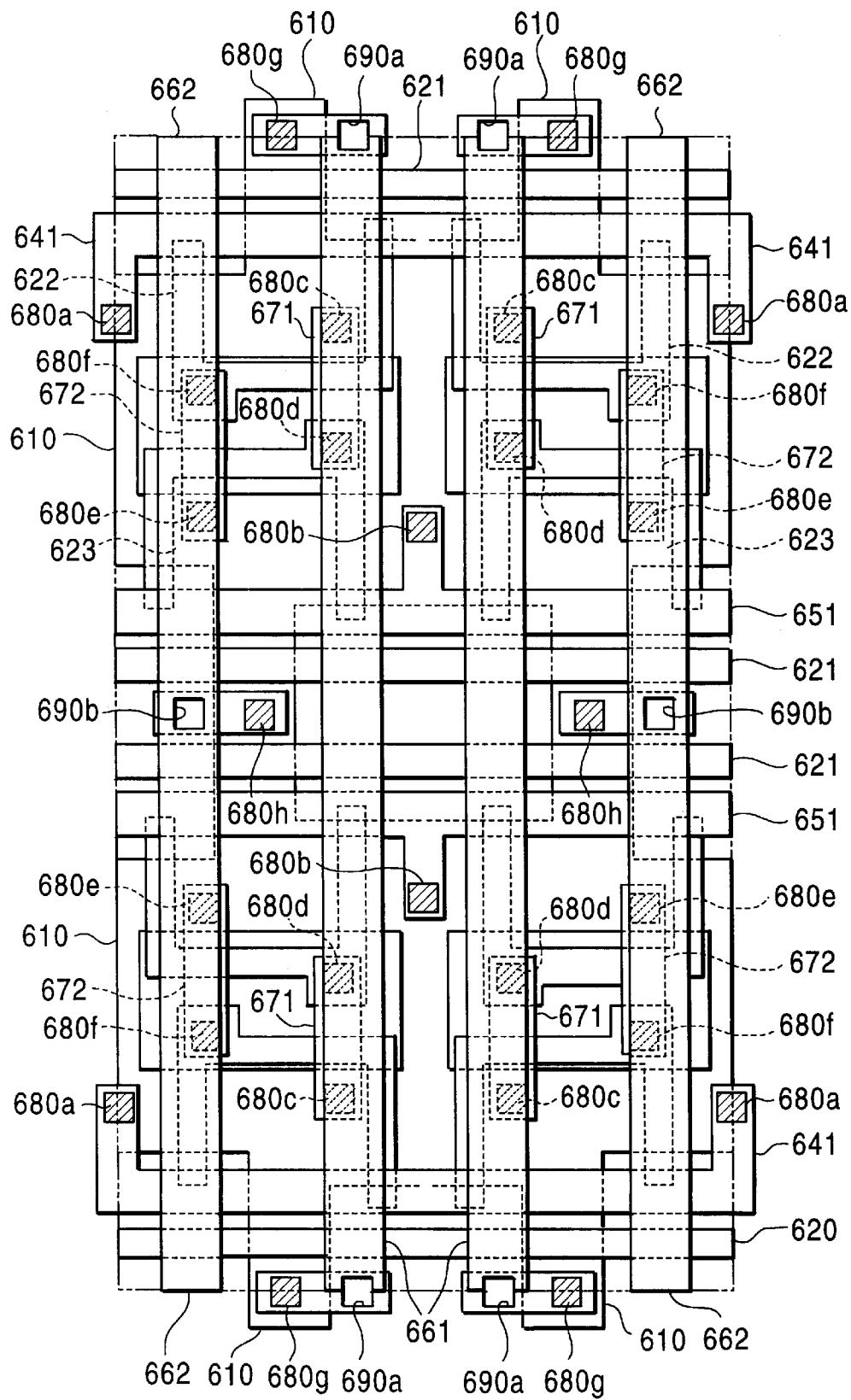
FIG. 13 is a plan view showing a structure in which CMOS inverters according to the second embodiment of the present invention are arranged in the form of a 2×2 matrix.

A structure in which the above CMOS SRAM cells are arranged in the form of a 2×2 matrix along cell boundary lines 1000 will be described next with reference to FIG. 13. In the second embodiment, as shown in FIG. 13, when an arbitrary CMOS SRAM cell is regarded as a reference cell, a CMOS SRAM cell placed on either the right or left side of the reference cell has a laterally reversed layout relative to the layout of the reference cell. Similarly, a CMOS SRAM cell placed on either the upper or lower side of the reference cell has a vertically reversed layout relative to the layout of the reference cell, and a CMOS SRAM cell placed at any oblique position with respect to the reference cell has a vertically and laterally reversed layout relative to the layout of the reference cell. Obviously, this structure is merely taken as an example in the second embodiment, and the concept of the present invention is not limited to this.

Referring to FIG. 13, the p+-type diffusion layer region 611 or the n+-type diffusion layer region 618 in FIG. 12 is shared between the adjacent cells. The Vdd potential is applied to the p+-type diffusion layer region 611 through the first aluminum interconnection 641 as a power supply interconnection and the contact hole 680a. The Gnd potential is applied to the n+-type diffusion layer region 618 through the first aluminum interconnection 651 as a ground interconnection and the contact hole 680b.

In the first embodiment, as shown in FIG. 10, a region in which the contact holes 180a to 180c and the through holes 190a to 190c, through which the Vdd potential or the Gnd potential is applied, are arranged must be ensured between the cells adjacent to each other in the vertical direction. The distance between the gate interconnection 122 of one cell and the gate interconnection 123 of the other cell is determined by this region. In contrast to this, in the second embodiment, since the word line WL is divided into the two gate interconnections 620 and 621, and the gate interconnections 620 and 621 are arranged on the upper and lower sides of each CMOS SRAM cell, MOS transistors constituting a flip-flop can be vertically arranged in a single cell. As a result, the contact holes 680a and 680b for applying the Vdd or Gnd potential can be properly arranged, and the region required in the first embodiment is not required. The distance between the gate interconnections 622 and 623 serving as the gates of transistors constituting a flip-flop can be reduced to the minimum distance between gate interconnections which is defined by the process technique.

In the CMOS SRAM cell of the second embodiment described above, the area of a rectangular region F1-F2-F3-F4 including the diffusion layer region in which the p+-type diffusion layer region 612 and the n+-type diffusion layer region 613 are formed in FIG. 12 is equal to the area Sa in the first embodiment described above. As in the first embodiment, therefore, the area of the rectangular region in the second embodiment is smaller than that in reference 2. In addition, according to the second embodiment, as described above, the word line WL is divided into the two gate interconnections, and the interconnections are vertically arranged as the gate interconnections 620 and 621 in a single cell. With this arrangement, therefore, of the spaces between the gates of the MOS transistors constituting the flip-flop, the space between the vertically arranged gate interconnections 622 and 623 can be set to be smaller than the space between the vertically arranged gate interconnections 121 or between gate interconnections 122 in the first embodiment in FIG. 10.

Assume that the CMOS SRAM cells according to the second embodiment and reference 2 are manufactured by a CMOS process technique based on a 0.35-μm rule. In this case, the area of each SRAM cell in the second embodiment is about 7% smaller than that in reference 2. That is, a reduction in cell area in the second embodiment is larger than that in the first embodiment.

In both the first and second embodiments, an NMOS transistor is used as a MOS transistor serving as a transfer gate. However, a PMOS transistor may be used. In this case, the concept of the present invention is applied in such a manner that the drain region of a PMOS transistor of a flip-flop and the source or drain region of the PMOS transistor serving as the transfer gate are formed by a common p+-type diffusion layer region.

What is claimed is:

1. A CMOS SRAM cell formed on an SOI substrate and comprising a flip-flop having first and second NMOS transistors and first and second PMOS transistors, transfer gates having first and second MOS transistors, and a word line section, wherein said word line section extends along a predetermined direction, wherein source and drain diffusion layer regions of said first and second NMOS transistors and said first and second PMOS transistors are arranged along the predetermined direction, and gates of said first and second NMOS transistors and said first and second PMOS transistors are arranged on channel regions thereof in a direction perpendicular to the predetermined direction, wherein the gate of said first NMOS transistor is electrically connected to the gate of said first PMOS transistor, wherein the gate of said second NMOS transistor is electrically connected to the gate of said second PMOS transistor, wherein in a region between the gate of said first NMOS transistor on a channel region thereof and the gate of said first PMOS transistor on a channel region thereof, the drain diffusion layer region of said first NMOS transistor, the drain diffusion layer region of said first PMOS transistor, and one of the drain and source diffusion layer regions of said first MOS transistor are arranged to be adjacent to each other and are electrically connected to each other through a diffusion layer interconnection, and wherein in a region between the gate of said second NMOS transistor on a channel region thereof and the gate of said second PMOS transistor on a channel region thereof, the drain diffusion layer region of said second NMOS transistor, the drain diffusion layer region of said second PMOS transistor, and one of the drain and source diffusion layer regions of said second MOS transistor are arranged to be adjacent to each other and are electrically connected to each other through a diffusion layer interconnection.

2. A cell according to claim 1, wherein said word line section is one word line serving as a gate common to said first and second MOS transistors.

3. A cell according to claim 1, wherein said word line section is used to input electrically equivalent signals and is constituted by first and second word lines which are electrically isolated from each other in said CMOS SRAM cell, said first word line serving as a gate of said first MOS transistor, and said second word line serving as a gate of said second MOS transistor.

4. A semiconductor memory device comprising a plurality of CMOS SRAM cells each defined by claim 1, wherein at least one pair of adjacent CMOS SRAM cells of said plurality of CMOS SRAM cells share the source diffusion layer region of at least one of said first and second NMOS transistors.

5. A semiconductor memory device comprising a plurality of CMOS SRAM cells each defined by claim 1, wherein at least one pair of adjacent CMOS SRAM cells of said plurality of CMOS SRAM cells share the source diffusion layer region of at least one of said first and second PMOS transistors.

6. A semiconductor memory device comprising a plurality of CMOS SRAM cells each defined by claim 1, wherein at least one pair of adjacent CMOS SRAM cells of said plurality of CMOS SRAM cells share one of the source and drain diffusion layer regions of at least one of said first and second MOS transistors.

7. A semiconductor memory device comprising a CMOS SRAM cell formed on an SOI substrate and including a flip-flop, a transfer gate, and at least one word line coupled to said transfer gate,
wherein MOS transistors that provide memory functionality in said CMOS SRAM cell are oriented in a direction parallel to said word line,
wherein all gates of said MOS transistors in said CMOS SRAM cell are oriented in a direction perpendicular to said word line,
and wherein in a region between gates of PMOS and NMOS transistors electrically connected to each other, all gates of said MOS transistors oriented in a direction perpendicular to said word line, a drain diffusion layer region of said PMOS transistor, a drain diffusion layer region of said NMOS transistor, and a drain or source diffusion layer region of a MOS transistor of said transfer gate are electrically connected to each other through a diffusion layer interconnection.

8. A semiconductor device, comprising:
a substrate;
a first region of a first conductive type, formed on said substrate to provide first and second gate transfer transistors and first and second flip-flop transistors, each of said first and second gate transfer transistors each having a source/drain region that corresponds to a source/drain region of a respective one of said first and second flip-flop transistors;
at least one word line, coupled to a gate of at least one of said first and second gate transfer transistors, said at least one word line having a direction on said substrate; and
a second region of a second conductive type opposite to said first conductive type, said second region being formed on said substrate adjacent to said first region to provide third and fourth flip-flop transistors, each having a source/drain region electrically coupled by a diffusion layer to a source/drain region of a respective one of said first and second flip-flop transistors, a gate of said first flip-flop transistor being coupled to a gate of said third flip-flop transistor and a gate of said second flip-flop transistor being coupled to a gate of said fourth flip-flop transistor, wherein source/drain regions of said flip-flop transistors are oriented in a direction that is substantially parallel to the direction of said at least one word line.

9. A semiconductor device, according to claim 8, wherein said first conductive type is n+ type and said second conductive type is p+ type.

10. A semiconductor device, according to claim 8, wherein a single word line is coupled to both gates of said first and second transfer transistors.

11. A semiconductor device, according to claim 8, wherein a first word line is coupled to the gate of said first transfer transistor and a second word line is coupled to the gate of said second transfer transistor.

12. A semiconductor device, according to claim 8, wherein source/drain regions of said first and second flip-flop transistors that are coupled to respective source/drain regions of said third and fourth flip-flop transistors are connected at adjacent portions of said first and second regions.

13. A semiconductor device, according to claim 12, further comprising:
silicide connectors disposed on source/drain regions of said first and second flip-flop transistors to provide electrical connection to respective source/drain regions of said third and fourth flip-flop transistors.

14. A semiconductor device, according to claim 8, wherein said second region includes two subregions that are substantially separated by said first region.

15. A semiconductor device, according to claim 8, wherein gates of said flip-flop transistors extend in a direction that is substantially perpendicular to the direction of said at least one word line.

16. A semiconductor device, according to claim 8, wherein one source/drain region of each of said first and third flip-flop transistors and said first transfer transistor are electrically coupled in a first area on said substrate and wherein one source/drain region of each of said second and fourth flip-flop transistors and said second transfer transistor are electrically coupled on a second area of said substrate.

17. A semiconductor device, according to claim 8, wherein said first region is shared with an adjacent semiconductor device having a region corresponding to said first region.

18. A semiconductor device, according to claim 8, wherein said second region is shared with an adjacent semiconductor device having a region corresponding to said second region.

19. A semiconductor device, according to claim 8, wherein said substrate is an SOI substrate.

20. A semiconductor device, comprising:
a substrate;
first region means of a first conductive type, formed on said substrate, for providing first and second gate transfer transistors and first and second flip-flop transistors, each of said first and second gate transfer transistors each having a source/drain region that corresponds to a source/drain region of a respective one of said first and second flip-flop transistors;
word line means, coupled to at least one gate of said first and second gate transfer transistors, said word line means having a direction on said substrate; and
second region means of a second conductive type opposite to said first conductive type, said second region means being formed on said substrate adjacent to said first region means, said second region means providing third and fourth flip-flop transistors, each having a source/drain region electrically coupled by a diffusion layer to a source/drain region of a respective one of said first and second flip-flop transistors, a gate of said first flip-flop transistor being coupled to a gate of said third flip-flop transistor and a gate of said second flip-flop transistor being coupled to a gate of said fourth flip-flop transistor, wherein source/drain regions of said flip-flop transistors are oriented in a direction that is substantially parallel to the direction of said word line means.

21. A semiconductor device, according to claim 20, wherein said first region means includes an n+ type diffusion region and said second region means includes a p+ type diffusion region.

22. A semiconductor device, according to claim 20, wherein said word line means includes a single word line coupled to both gates of said first and second transfer transistors.

23. A semiconductor device, according to claim 20, wherein said word line means includes a first word line coupled to the gate of said first transfer transistor and a second word line coupled to the gate of said second transfer transistor.

24. A semiconductor device, comprising:

first and second transfer transistors, said first transfer transistor having a gate with a first word line connected thereto, said first word line being oriented in a particular direction;

first and second flip-flop transistors of a first type;

third and fourth flip-flop transistors of a second type, said third flip-flop transistor having a source/drain region electrically coupled by a diffusion layer to a source/drain region of said first flip-flop transistor, and coupled to a source/drain region of said first transfer transistor and to gates of said second and fourth flip-flop transistor, said fourth flip-flop transistor having a source/drain region electrically coupled by a diffusion layer to a source/drain region of said second flip-flop transistor, and coupled to a source/drain region of said second transfer transistor and to gates of said first and third flip-flop transistors, wherein source/drain regions of said flip-flop transistors are aligned in a direction substantially parallel to said first word line.

25. A semiconductor device, according to claim 24, wherein said first word line is also connected to the gate of said second transfer transistor.

26. A semiconductor device, according to claim 24, further comprising:

a second word line coupled to the gate of said second transfer transistor.

27. A semiconductor device, according to claim 24, wherein said transfer transistors and said first and second flip-flop transistors are formed in a first semiconductor region disposed on a substrate and wherein said third and fourth flip-flop transistors are formed on a second semiconductor region disposed on the substrate adjacent to said first semiconductor region.

28. A semiconductor device, according to claim 27, wherein said second semiconductor region includes two subregions that are substantially separated by said first semiconductor region.

29. A semiconductor device, according to claim 27, wherein gates of said flip-flop transistors are oriented in a direction that is substantially perpendicular to the direction of said first word line.

30. A semiconductor device, according to claim 27, wherein said first semiconductor region is an n+ type region and said second region is a p+ type region.

* * * * *